United States Patent
Li

(10) Patent No.: US 9,568,793 B2
(45) Date of Patent: Feb. 14, 2017

(54) ARRAY SUBSTRATE AND METHOD OF REPAIRING BROKEN LINES FOR THE ARRAY SUBSTRATE

(71) Applicant: Shenzhen China Star Optoelectronics Technology Co., Ltd., Shenzhen (CN)

(72) Inventor: Shan Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/781,593

(22) PCT Filed: Apr. 1, 2015

(86) PCT No.: PCT/CN2015/075674
§ 371 (c)(1),
(2) Date: Oct. 1, 2015

(87) PCT Pub. No.: WO2016/119303
PCT Pub. Date: Aug. 4, 2016

(65) Prior Publication Data
US 2016/0363829 A1    Dec. 15, 2016

(30) Foreign Application Priority Data
Jan. 27, 2015   (CN) .......................... 2015 1 0042169

(51) Int. Cl.
H01L 21/00    (2006.01)
G02F 1/1362   (2006.01)
G02F 1/1333   (2006.01)
G02F 1/1335   (2006.01)
H01L 27/12    (2006.01)

(52) U.S. Cl.
CPC ... G02F 1/136259 (2013.01); G02F 1/133345 (2013.01); G02F 1/133514 (2013.01); G02F 1/136286 (2013.01); H01L 27/1248 (2013.01); *G02F 2001/136263* (2013.01); *G02F 2201/121* (2013.01)

(58) Field of Classification Search
CPC ................... G02F 1/136259; G02F 1/133345; G02F 1/133514; G02F 1/136286; H01L 27/1248
See application file for complete search history.

(56) References Cited

U.S. PATENT DOCUMENTS

2007/0018168 A1* 1/2007 Oh ........................ H01L 27/124
257/72
2009/0102998 A1* 4/2009 Lin ................... G02F 1/136259
349/54

* cited by examiner

*Primary Examiner* — Richard Booth
(74) *Attorney, Agent, or Firm* — Leong C. Lei

(57) ABSTRACT

The present invention provides an array substrate and a method of repairing broken lines for the array substrate. By preserving the via on the organic layer corresponding to the cross point of the source-drain data line and the common electrode line, the aperture formed with the second passivation layer deposed in the via is employed to be the laser welding point as the source-drain data line is broken. After detecting the broken line position of the source-drain, the laser welding is implemented to the apertures at two ends of the broken line position to lap the source-drain data line with the closed ring of the common electrode line, and meanwhile, the connection lines at two sides of the closed ring of the common electrode line is cut with laser, and the closed ring of the common electrode line is employed to repair the broken line part of the source-drain data line.

13 Claims, 4 Drawing Sheets

ARRAY SUBSTRATE AND METHOD OF REPAIRING BROKEN LINES FOR THE ARRAY SUBSTRATE

FIELD OF THE INVENTION

The present invention relates to a display skill field, and more particularly to an array substrate and a method of repairing broken lines for the array substrate.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a shell, a liquid crystal display panel located in the shell and a backlight module located in the shell. The liquid crystal display panel is a major component of the liquid crystal display. However, the liquid crystal display panel itself does not emit light and needs the back light module to provide light source for normally showing images.

Generally, the liquid crystal display panel is formed by laminating two glass substrates and injecting liquid crystals between the two glass substrates. At the relative inner sides of the two glass substrates, the pixel electrode and the common electrode lines are respectively located, and the light of backlight module is reflected to generate images by applying driving voltages to control whether the liquid crystal molecules to be changed directions.

In the liquid crystal panel, the pixel electrode voltage is mainly controlled with the Thin Film Transistor (TFT) switch. In the component of the TFT switch, particularly in the ultra high resolution liquid crystal panel, the line width of the data line providing the image signal is very narrow. The broken line can easily happen in the manufacture process, it requires the laser to implement the operation of the broken line repair. As regarding the wide view angle liquid crystal panel technology, for promoting the aperture ratio and the response speed of the liquid crystal, the organic layer, such as a color resist layer or a flat layer will be manufactured on the array substrate of the liquid crystal panel. When the broken line defect happened to the data line, the thickness of the organic layer is larger, and the broken line repair cannot be directly implemented. It needs a laser for removing the organic layer. Then, the welding operation of the line is implemented. Therefore, the power consumption of the laser energy is large, and the time is long. The default contact can easily happen and thus influence the yield of the production because the contact surface is irregular and not flat after utilizing the laser to remove the organic layer.

SUMMARY OF THE INVENTION

An objective of the present invention is to provide an array substrate. By preserving the via on the organic layer corresponding to the cross point of the source-drain data line and the common electrode line, the second passivation layer is deposed in the via to form the aperture, and the aperture is employed to be the laser welding point as the source-drain data line is broken.

Another objective of the present invention is to provide a method of repairing broken lines for the array substrate, which can omit the process of removing the organic layer to raise the repair efficiency of the broken line and reduce the laser loss, and as implementing laser welding, the contact interface is smooth which can effectively raise the broken line repair success rate.

For realizing the aforesaid objectives, the present invention provides an array substrate, comprising a substrate, a gate scan line and a common electrode line positioned on the substrate, a gate isolation layer positioned on the gate scan line and the common electrode line, a source-drain data line positioned on the gate isolation layer, a first passivation layer positioned on the source-drain data line, an organic layer positioned on the first passivation layer and a second passivation layer positioned on the organic layer and the first passivation layer;

the common electrode line comprises a plurality of closed rings and a plurality of connection lines, and the plurality of closed rings are connected together with the plurality of connection lines, and the closed rings and the source-drain data line are across arranged, and a via is provided on the organic layer corresponding to each cross point, and the second passivation layer is deposed in the via to form an aperture, and the aperture is employed to be a laser welding point as the source-drain data line is broken.

A dimension of the aperture is 7 µm×7 µm.

The organic layer is a color resist layer or a flat layer.

Material of the first passivation layer and the second passivation layer is inorganic material.

A thickness of the organic layer is larger than thicknesses of the first passivation layer and the second passivation layer.

The present invention further provides an array substrate, comprising a substrate, a gate scan line and a common electrode line positioned on the substrate, a gate isolation layer positioned on the gate scan line and the common electrode line, a source-drain data line positioned on the gate isolation layer, a first passivation layer positioned on the source-drain data line, an organic layer positioned on the first passivation layer and a second passivation layer positioned on the organic layer and the first passivation layer;

the common electrode line comprises a plurality of closed rings and a plurality of connection lines, and the plurality of closed rings are connected together with the plurality of connection lines, and the closed rings and the source-drain data line are across arranged, and a via is provided on the organic layer corresponding to each cross point, and the second passivation layer is deposed in the via to form an aperture, and the aperture is employed to be a laser welding point as the source-drain data line is broken;

wherein a dimension of the aperture is 7 µm×7 µm;

wherein the organic layer is a color resist layer or a flat layer.

The present invention further provides a method of repairing broken lines for an array substrate, comprising steps of:

step 1, providing an array substrate, and the array substrate comprises a substrate, a gate scan line and a common electrode line positioned on the substrate, a gate isolation layer positioned on the gate scan line and the common electrode line, a source-drain data line positioned on the gate isolation layer, a first passivation layer positioned on the source-drain data line, an organic layer positioned on the first passivation layer and a second passivation layer positioned on the organic layer and the first passivation layer;

the common electrode line comprises a plurality of closed rings and a plurality of connection lines, and the plurality of closed rings are connected together with the plurality of connection lines, and the closed rings and the source-drain data line are across arranged, and a via is provided on the organic layer corresponding to each cross point, and the second passivation layer is deposed in the via to form an aperture, and the aperture is employed to be a laser welding point as the source-drain data line is broken;

step 2, detecting a broken line position of the source-drain data line, and implementing laser welding to the apertures at two ends of the broken line position to lap the source-drain data line with the closed ring of the common electrode line;

step 3, cutting the connection lines at two sides of the closed ring of the common electrode line with laser, and replacing a broken line part of the source-drain data line with the closed ring of the common electrode line to achieve a broken line repair of the source-drain data line.

In the step 1, a dimension of the aperture is 7 μm×7 μm.

In the step 1, the organic layer is a color resist layer or a flat layer.

In the step 1, material of the first passivation layer and the second passivation layer is inorganic material.

In the step 1, a thickness of the organic layer is larger than thicknesses of the first passivation layer and the second passivation layer.

The benefits of the present invention are: in the array substrate and the method of repairing broken lines for the array substrate according to the present invention, by preserving the via on the organic layer corresponding to the cross point of the source-drain data line and the common electrode line, the aperture formed with the second passivation layer deposed in the via is employed to be the laser welding point as the source-drain data line is broken. After detecting the broken line position of the source-drain, the laser welding is implemented to the apertures at two ends of the broken line position to lap the source-drain data line with the closed ring of the common electrode line, and meanwhile, the connection lines at two sides of the closed ring of the common electrode line is cut with laser, and the closed ring of the common electrode line is employed to repair the broken line part of the source-drain data line; because at the aperture, the organic layer of which the thickness is larger is not positioned above the source-drain data line, the process of removing the organic layer with laser is omitted as implementing broken line repair. The issue that in the present process, the power consumption of laser energy is large, and the time is long, and the default contact can easily happen and thus influence the yield of the production because the contact surface is irregular and not flat after utilizing the laser to remove the organic layer. The efficiency and the successive rate of the broken line repair can be effectively raised.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
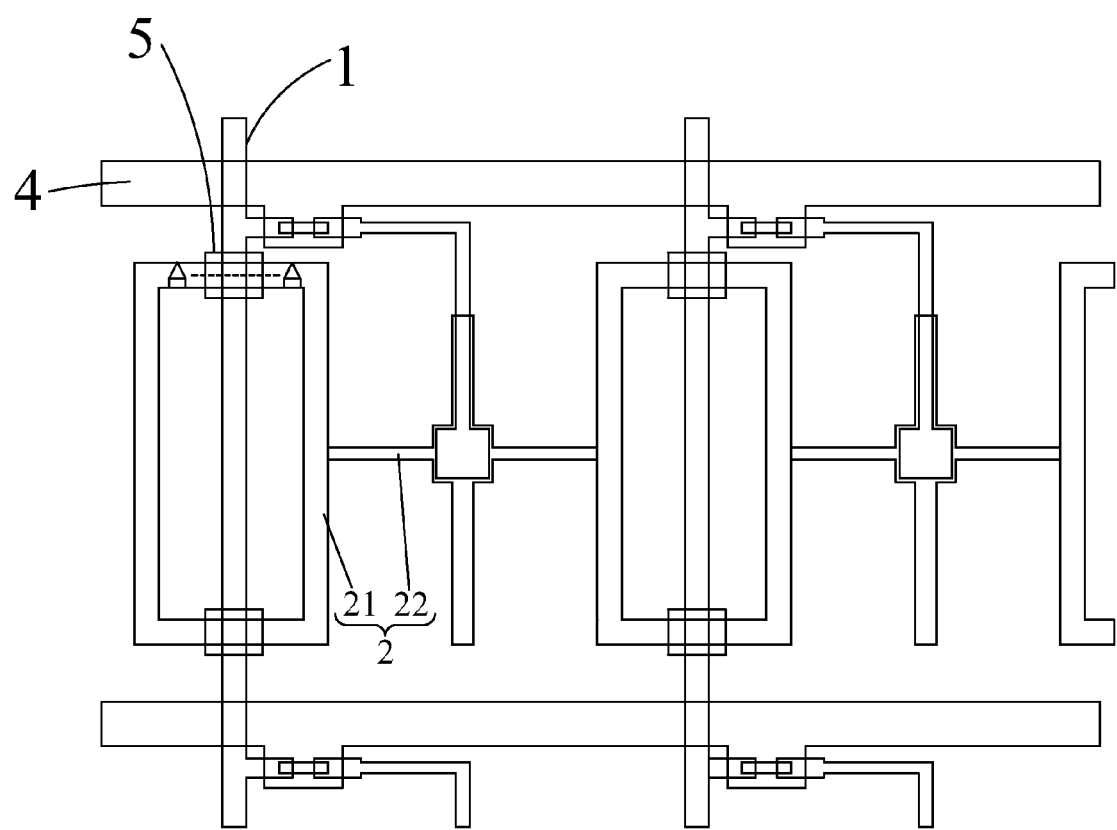
FIG. 1 is a structural diagram of an array substrate according to the present invention.
Figure 2:
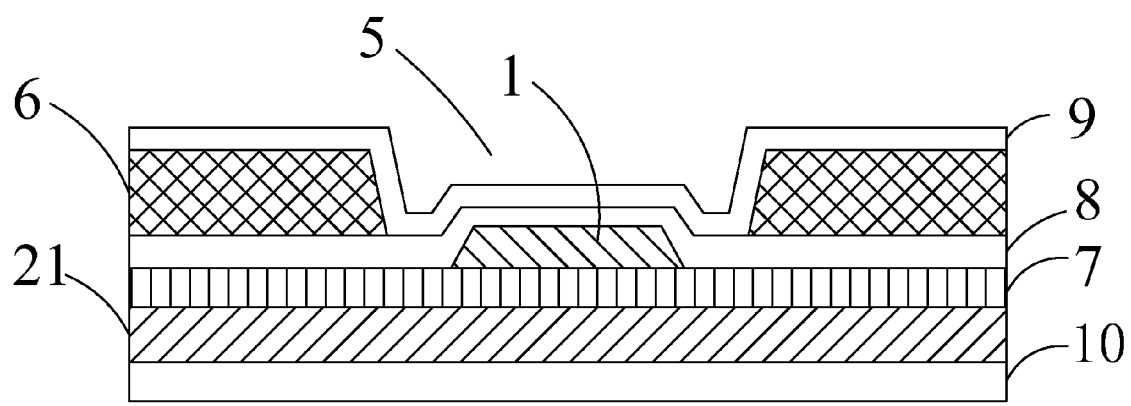
FIG. 2 is a sectional diagram along the A-A line at the aperture 5 of the array substrate shown in FIG. 1.

Please refer to FIG. 1 and FIG. 2. The present invention first provides an array substrate, comprising a substrate 10, a gate scan line 4 and a common electrode line 2 positioned on the substrate 10, a gate isolation layer 7 positioned on the gate scan line 4 and the common electrode line 2, a source-drain data line 1 positioned on the gate isolation layer 7, a first passivation layer 8 positioned on the source-drain data line 1, an organic layer 6 positioned on the first passivation layer 8 and a second passivation layer 9 positioned on the organic layer 6 and the first passivation layer 8;

Specifically, the common electrode line 2 comprises a plurality of closed rings 21 and a plurality of connection lines 22, and the plurality of closed rings 21 are connected together with the plurality of connection lines 22, and the closed rings 21 and the source-drain data line 1 are across arranged, and a via is provided on the organic layer 6 corresponding to each cross point, and the second passivation layer 9 is deposed in the via to form an aperture 5, and the aperture 5 is employed to be a laser welding point as the source-drain data line 1 is broken for connecting the source-drain data line 1 and the closed ring 21 of the common electrode line 2.

Preferably, a dimension of the aperture 5 is 7 μm×7 μm.

Specifically, the organic layer 6 is a color resist layer or a flat layer; material of the first passivation layer 8 and the second passivation layer 9 is inorganic material; a thickness of the organic layer 6 is larger than thicknesses of the first passivation layer 8 and the second passivation layer 9.

By preserving the via on the organic layer 6 corresponding to the cross point of the source-drain data line 1 and the common electrode line 2, the second passivation layer 9 is deposed in the via to form the aperture 5 to be the laser welding point as the source-drain data line is broken. Because at the aperture 5, the organic layer 6 of which the thickness is larger is not positioned above the source-drain data line 1, the process of removing the organic layer 6 with laser is omitted as implementing broken line repair. The issue that in the present process, the power consumption of laser energy is large, and the time is long, and the default contact can easily happen and thus influence the yield of the production because the contact surface is irregular and not flat after utilizing the laser to remove the organic layer 6. The efficiency and the successive rate of the broken line repair can be effectively raised.

Figure 3:
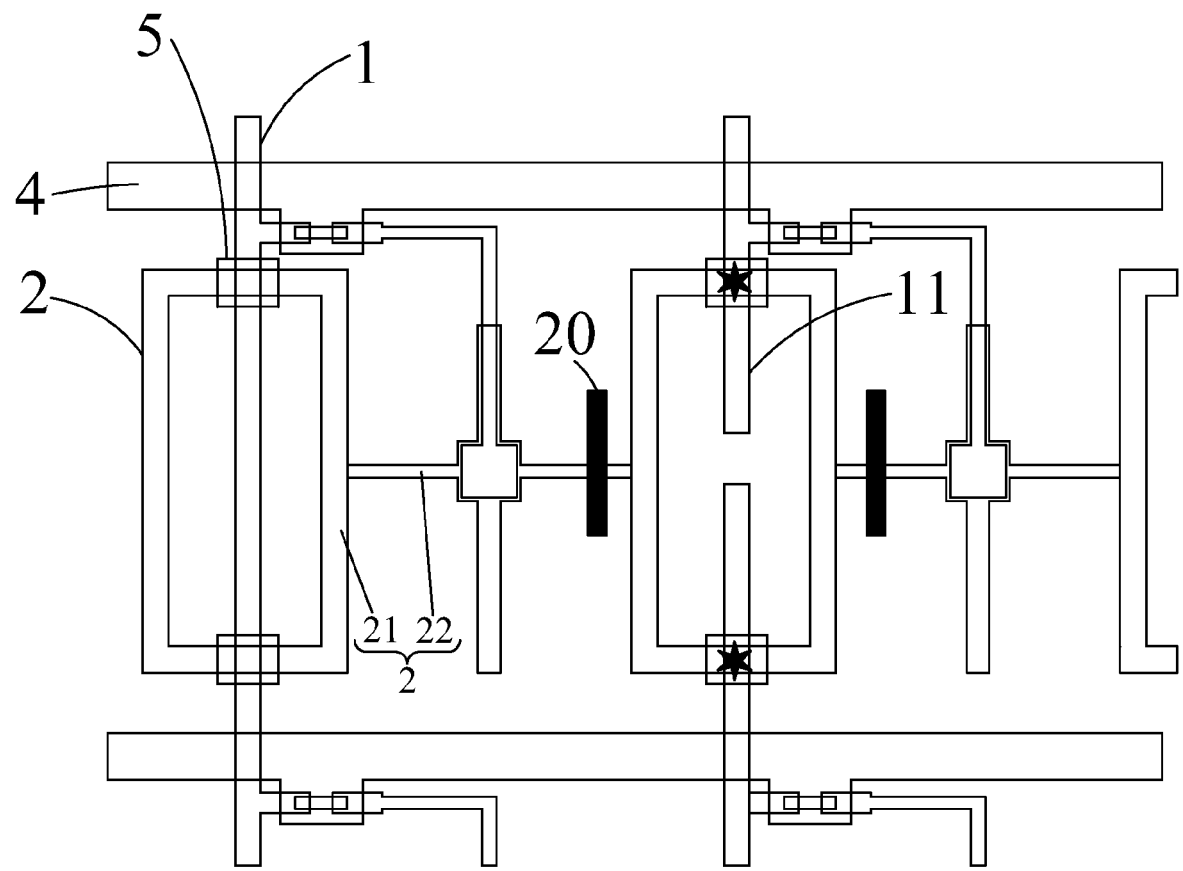
FIG. 3 is a diagram of a method of repairing broken lines for an array substrate according to the present invention.
Figure 4:
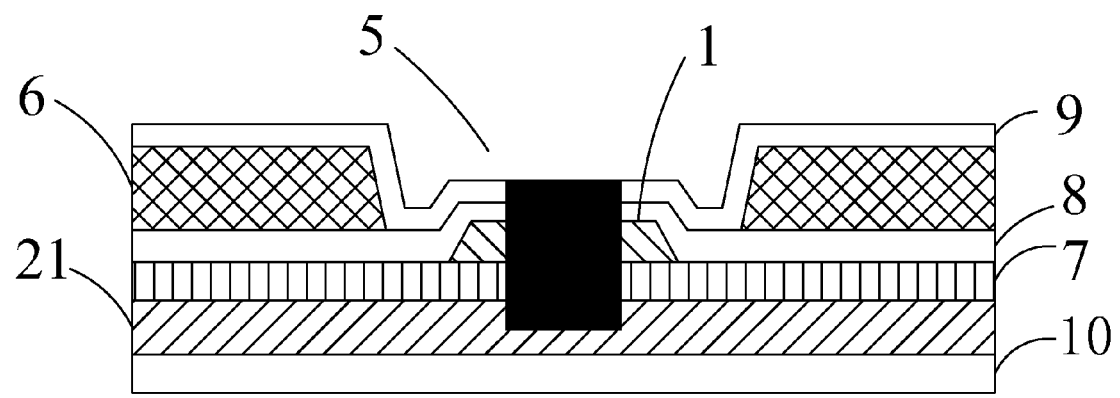
FIG. 4 is a sectional diagram of the step 2 in the method of repairing broken lines for the array substrate according to the present invention.

Please refer to FIG. 3 and FIG. 4. The present invention further provides a method of repairing broken lines for an array substrate, comprising steps of:

step 1, providing an array substrate, and the array substrate comprises a substrate 10, a gate scan line 4 and a common electrode line 2 positioned on the substrate 10, a gate isolation layer 7 positioned on the gate scan line 4 and the common electrode line 2, a source-drain data line 1 positioned on the gate isolation layer 7, a first passivation layer 8 positioned on the source-drain data line 1, an organic layer 6 positioned on the first passivation layer 8 and a second passivation layer 9 positioned on the organic layer 6 and the first passivation layer 8;

Specifically, the common electrode line 2 comprises a plurality of closed rings 21 and a plurality of connection lines 22, and the plurality of closed rings 21 are connected together with the plurality of connection lines 22, and the closed rings 21 and the source-drain data line 1 are across arranged, and a via is provided on the organic layer 6 corresponding to each cross point, and the second passivation layer 9 is deposed in the via to form an aperture 5, and the aperture 5 is employed to be a laser welding point as the source-drain data line 1 is broken for connecting the source-drain data line 1 and the common electrode line 2.

Preferably, a dimension of the aperture 5 is 7 µm×7 µm.

Specifically, the organic layer 6 is a color resist layer or a flat layer; material of the first passivation layer 8 and the second passivation layer 9 is inorganic material; a thickness of the organic layer 6 is larger than thicknesses of the first passivation layer 8 and the second passivation layer 9.

step 2, detecting a broken line position of the source-drain data line 1, and implementing laser welding to the apertures 5 at two ends of the broken line position to lap the source-drain data line 1 with the closed ring 21 of the common electrode line 2 to repair the broken source-drain data line to be an unbroken source-drain data line.

step 3, cutting the connection lines 22 at two sides of the closed ring 21 of the common electrode line 2 with laser, and the cutting position is a position 20 shown in FIG. 3, and replacing a broken line part 11 of the source-drain data line 1 with the closed ring 21 of the common electrode line 2 to achieve a broken line repair of the source-drain data line 1. The data signal is transmitted through the new source-drain data line composed by the unbroken part of the source-drain data line and the closed ring 21, and the connection lines 22 at two sides of the closed ring 21 are cut, it can be ensured that the signal transmittance path of the repaired new source-drain data line is the same as the designed path, and no interference happens to other signals.

The method of repairing broken lines for an array substrate can be applied for the broken line repairs of the liquid crystal panels of IPS (In-Plane Switching) type, FFS (Fringe Field Switching) type and COA (Color Filter On Array) type.

In the method of repairing broken lines for an array substrate according to the present invention, by implementing laser welding at the apertures 5 at two ends of the broken line position of the source-drain data line 1, the source-drain data line 1 is lapped with the closed ring 21 of the common electrode line 2, and meanwhile, by cutting the connection lines 22 at two sides of the closed ring 21 of the common electrode line 2 with laser, the broken line part of the source-drain data line 1 is repaired with the closed ring 21 of the common electrode line 2; because at the aperture 5, the organic layer 6 of which the thickness is larger is not positioned above the source-drain data line 1, the process of removing the organic layer 6 with laser is omitted as implementing broken line repair. The issue that in the present process, the power consumption of laser energy is large, and the time is long, and the default contact can easily happen and thus influence the yield of the production because the contact surface is irregular and not flat after utilizing the laser to remove the organic layer 6. The efficiency and the successive rate of the broken line repair can be effectively raised.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An array substrate, comprising a substrate, a gate scan line and a common electrode line positioned on the substrate, a gate isolation layer positioned on the gate scan line and the common electrode line, a source-drain data line positioned on the gate isolation layer, a first passivation layer positioned on the source-drain data line, an organic layer positioned on the first passivation layer and a second passivation layer positioned on the organic layer and the first passivation layer;

the common electrode line comprises a plurality of closed rings and a plurality of connection lines, and the plurality of closed rings are connected together with the plurality of connection lines, and the closed rings and the source-drain data line are across arranged, and a via is provided on the organic layer corresponding to each cross point, and the second passivation layer is deposed in the via to form an aperture, and the aperture is employed to be a laser welding point as the source-drain data line is broken.

2. The array substrate according to claim 1, wherein a dimension of the aperture is 7 µm×7 µm.

3. The array substrate according to claim 1, wherein the organic layer is a color resist layer or a flat layer.

4. The array substrate according to claim 1, wherein material of the first passivation layer and the second passivation layer is inorganic material.

5. The array substrate according to claim 1, wherein a thickness of the organic layer is larger than thicknesses of the first passivation layer and the second passivation layer.

6. An array substrate, comprising a substrate, a gate scan line and a common electrode line positioned on the substrate, a gate isolation layer positioned on the gate scan line and the common electrode line, a source-drain data line positioned on the gate isolation layer, a first passivation layer positioned on the source-drain data line, an organic layer positioned on the first passivation layer and a second passivation layer positioned on the organic layer and the first passivation layer;

the common electrode line comprises a plurality of closed rings and a plurality of connection lines, and the plurality of closed rings are connected together with the plurality of connection lines, and the closed rings and the source-drain data line are across arranged, and a via is provided on the organic layer corresponding to each cross point, and the second passivation layer is deposed in the via to form an aperture, and the aperture is employed to be a laser welding point as the source-drain data line is broken;

wherein a dimension of the aperture is 7 µm×7 µm;

wherein the organic layer is a color resist layer or a flat layer.

7. The array substrate according to claim 6, wherein material of the first passivation layer and the second passivation layer is inorganic material.

8. The array substrate according to claim 6, wherein a thickness of the organic layer is larger than thicknesses of the first passivation layer and the second passivation layer.

9. A method of repairing broken lines for an array substrate, comprising steps of:

step 1, providing an array substrate, and the array substrate comprises a substrate, a gate scan line and a common electrode line positioned on the substrate, a gate isolation layer positioned on the gate scan line and the common electrode line, a source-drain data line positioned on the gate isolation layer, a first passivation layer positioned on the source-drain data line, an organic layer positioned on the first passivation layer and a second passivation layer positioned on the organic layer and the first passivation layer;

the common electrode line comprises a plurality of closed rings and a plurality of connection lines, and the plurality of closed rings are connected together with the plurality of connection lines, and the closed rings and the source-drain data line are across arranged, and a via is provided on the organic layer corresponding to each cross point, and the second passivation layer is deposed in the via to form an aperture, and the aperture is employed to be a laser welding point as the source-drain data line is broken;

step 2, detecting a broken line position of the source-drain data line, and implementing laser welding to the apertures at two ends of the broken line position to lap the source-drain data line with the closed ring of the common electrode line;

step 3, cutting the connection lines at two sides of the closed ring of the common electrode line with laser, and replacing a broken line part of the source-drain data line with the closed ring of the common electrode line to achieve a broken line repair of the source-drain data line.

10. The method of repairing broken lines for an array substrate according to claim 9, wherein in the step 1, a dimension of the aperture is 7 μm×7 μm.

11. The method of repairing broken lines for an array substrate according to claim 9, wherein in the step 1, the organic layer is a color resist layer or a flat layer.

12. The method of repairing broken lines for an array substrate according to claim 9, wherein in the step 1, material of the first passivation layer and the second passivation layer is inorganic material.

13. The method of repairing broken lines for an array substrate according to claim 9, wherein in the step 1, a thickness of the organic layer is larger than thicknesses of the first passivation layer and the second passivation layer.

* * * * *